United States Patent [19]
Kinoshita

[11] Patent Number: 5,920,107
[45] Date of Patent: Jul. 6, 1999

[54] SEMICONDUCTOR INTEGRATED CIRCUIT DEVICE WITH HIGH INTEGRATION DENSITY

[75] Inventor: Yasushi Kinoshita, Tokyo, Japan

[73] Assignee: NEC Corporation, Tokyo, Japan

[21] Appl. No.: 08/840,720

[22] Filed: Apr. 25, 1997

[30]    Foreign Application Priority Data

Apr. 25, 1996  [JP]  Japan .................................. 8-105494

[51] Int. Cl.⁶ .............................. H01L 29/76; H01L 29/00
[52] U.S. Cl. .......................... 257/499; 257/376; 257/509
[58] Field of Search .................................... 257/509, 511, 257/525, 526, 370, 376

[56]           References Cited

U.S. PATENT DOCUMENTS

| | | | |
|---|---|---|---|
| 3,481,801 | 12/1969 | Hugle | 257/509 |
| 4,059,549 | 11/1977 | Furuhata | 257/370 |
| 5,406,106 | 4/1995 | Hirai et al. | 257/370 |

FOREIGN PATENT DOCUMENTS

| | | | |
|---|---|---|---|
| 4303768 | 8/1993 | Germany | 257/370 |
| 62-193144 | 8/1987 | Japan . | |
| 63-131562 | 6/1988 | Japan . | |
| 2-45972 | 2/1990 | Japan . | |
| 3-136274 | 6/1991 | Japan . | |

*Primary Examiner*—Wael M. Fahmy
*Attorney, Agent, or Firm*—Whitham, Curtis & Whitham

[57]           ABSTRACT

In a semiconductor device having a PN junction element separating region, in order to reduce a width of the PN junction element separating region without sacrifice of a punch-through breakdown voltage of the PN junction element separating region, the PN junction element separating region is composed of an upper impurity layer of a first conductivity type having low impurity density and a lower impurity layer of the first conductivity type having a high impurity density and a width of the upper impurity layer is smaller than a width of the lower impurity layer.

2 Claims, 7 Drawing Sheets

SEMICONDUCTOR INTEGRATED CIRCUIT DEVICE WITH HIGH INTEGRATION DENSITY

BACKGROUND OF THE INVENTION

1. Field of the Invention

The present invention relates to a semiconductor integrated circuit device and, particularly, a structure of a buried layer of a Bi-CMOS device in which a bipolar transistor and a CMOS transistor are formed in one and same substrate.

2. Prior Art Description

FIG. 6 is a cross section of a conventional Bi-CMOS device when $P^+$ type buried layers and $N^+$ type buried layers are formed by using the self alignment.

The device has a structure in which the $N^+$ type buried layers 3 and the $P^+$ type buried layers 4 are formed in contact with each other in a P type silicon substrate 1 and below an N type epitaxial layer 5.

In a portion of the N type epitaxial layer 5 on the $N^+$ type buried layer 3, an N well region 6 is formed in which a P channel insulating gate field effect transistor (referred to as "MOS transistor", hereinafter) is formed and, in a portion of the N type epitaxial layer 5 on the $P^+$ type buried layers 4, a P well region 7 is formed in which an insulating region of the bipolar transistor and the N channel MOS transistor are formed.

Further, in another portion of the N type epitaxial layer 5 on the $N^+$ type buried layers 3, there is neither N type well 6 nor P type well 7 formed, resulting in an NPN bipolar transistor. Further, an N channel MOS transistor and a P channel MOS transistor are formed by forming a field insulating film 8, a gate oxide film 9, a gate electrode 10 of the N channel MOS transistor, a gate electrode 11 of the P channel MOS transistor, an N channel source•drain region 13 and a P channel source•drain region 14.

Further, an $N^+$ type collector lead region 12, an external base region 15, a base region 16 and an emitter region 17 of the NPN bipolar transistor are formed.

The $P^+$ type buried layer 4 surrounding the NPN transistor and the P type well region 7 thereof have a role of electrically separating the NPN bipolar transistor from others.

An usual manufacturing method of this integrated circuit device will be described with reference to FIGS. 7(a) to 7(f).

As shown in FIG. 7(a), a silicon oxide film 2 is grown on the P type silicon substrate 1 to a thickness of 30 to 100 nm and is then patterned by using the photolithography. Then, as shown in FIG. 7(b), an N type impurity such as arsenide is ion-injected to the silicon substrate 1 through the patterned silicon oxide film 2 as a mask under conditions of injecting energy of 40 to 80 keV and dose of $5\times10^{14}$ to $5\times10^{15}$ $cm^{-2}$. Thereafter, the wafer is heat treated in oxygen atmosphere at a temperature as high as 1000° C. to 1200° C. for 2 to 4 hours to immigrate arsenide into the P type silicon substrate 1. Thus, the region containing N type impurity at high density is rapidly oxidized, resulting in a thick silicon oxide film.

Then, the thermal oxide film 2 used as the mask is removed by wet etching. Thus, a pattern 301 of the $N^+$ type buried layer 3 is formed on the P type silicon substrate 1.

Then, as shown in FIG. 7(c), a P type impurity such as boron is ion injected to a whole surface of the substrate 1 under conditions of injecting energy of 80 to 120 keV and dose of $1\times10^{13}$ to $5\times10^{13}$ $cm^{-2}$. Thereafter, the $N^+$ type buried layers 3 and the $P^+$ type buried layers 4 are formed by epitaxially growing the N type epitaxial layer 5 to a thickness of 0.8 to 1.2 $\mu$m.

Then, as shown in FIG. 7(d), the P well region 7 is formed by ion-injecting an impurity such as boron with using a photo resist 18 having an opening 18A as a mask.

Then, as shown in FIG. 7(e), the N well region 6 is formed by ion-injecting an impurity such as phosphor with using a photo resist 19 having an opening 19A as a mask.

Thereafter, the field insulating layer 8 is formed by using the known preferential thermal oxidation, as shown in FIG. 7(f).

In the conventional bi-CMOS device having the $N^+$ type buried layers 3 and the $P^+$ type buried layers 4 in contact with the buried layers 3, there is a merit that the $N^+$ type buried layers 3 and the $P^+$ type buried layers 4 can be made contact with each other simply in a single lithographic step.

However, since the $N^+$ type buried layers 3 and the $P^+$ type buried layers 4 are in contact with each other, there is a problem that it is impossible to reduce an area required for insulating separation of the bipolar transistor.

FIG. 8 is a cross section of a region of the substrate in which bipolar transistors are arranged adjacent to each other and is useful to understand this problem.

In FIG. 8, X denotes a distance between the $N^+$ type buried layers 3, that is, a width of the $P^+$ type buried layer which corresponds to a width of the P well and Y denotes a distance between the external base region and the well region of the bipolar transistor. Therefore, the distance required to insulating and separating the bipolar transistor is $X+2Y$.

As a matter of convenience, leak-paths in the P well region, in the $P^+$ type buried layer 4, between the P well region 7 and the $P^+$ type external base region 15 and between the $P^+$ type buried layer 4 and the $P^+$ type external base region 15 are denoted by "a", "b", "c" and "d", respectively.

The value of X is determined by a punch-through between the N type epitaxial regions formed on both sides of the P well region or between the $N^+$ type buried layers formed on both sides of the $P^+$ type buried layer, that is, "a" or "b".

Since the impurity density of the $N^+$ type buried layer is generally higher than that of the N type epitaxial layer, the value of X is determined by "b".

On the other hand, the value of Y is determined by a punch-through between the external base region and the P well region or between the $P^+$ type buried layers, that is, "c" or "d". Leakage in "c" is the punch-through between the external base region having relatively high impurity density and the P well region and leakage in "d" is due to a rise out of the impurity from the $P^+$ type buried layer after the heat treatment step of the manufacturing steps of the device.

Although there is a dependency on the impurity density settings in various portions of the device, "c" is generally predominant over "d". Since, therefore, it is necessary to provide enough distances for both "b" and "c", it is impossible to reduce the width of the element separating region and thus it is impossible to improve the integration density of the semiconductor integrated circuit device.

SUMMARY OF THE INVENTION

An object of the present invention is to provide a semiconductor integrated circuit device of high integration density.

According to the present invention, the above object can be achieved by setting the length of leak-path ("b" in FIG.

2) in the P⁺ type buried layer larger than that of leak-path ("a" in FIG. 2) in the P well region and setting the length of leak-path ("c" in FIG. 2) between the P well region and the P⁺ type external base region larger than that of leak-path ("d" in FIG. 2) between the P⁺ type buried layer and the P⁺ type external base region. Since, with such settings, the distance X+2Y required to electrically separate the bipolar transistors can be reduced by an amount corresponding to the overlapped regions (401 in FIG. 2), it is possible to realize a semiconductor integrated circuit device having higher integration density.

DETAILED DESCRIPTION OF THE PREFERRED EMBODIMENTS

Figure 1:
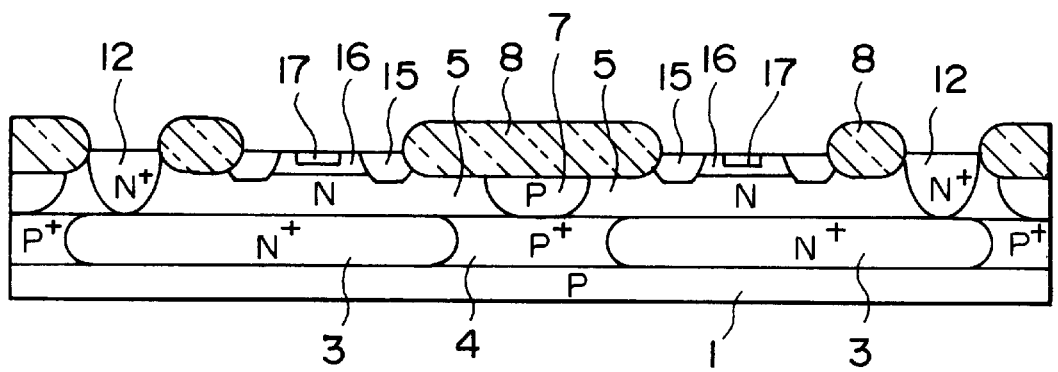
FIG. 1 is a cross section of a semiconductor integrated circuit device according to a first embodiment of the present invention.

The present invention will now be described with reference to the accompanying drawings. FIG. 1 is a cross section of a semiconductor integrated circuit device according to a first embodiment of the present invention, showing a region thereof in which NPN bipolar transistors are arranged in an adjacent relation.

In FIG. 1, an N⁺ type buried layer 3 and a P⁺ type buried layer 4 in contact with the N³⁰ type buried layer 3 are formed in a P type silicon substrate 1.

The bipolar transistors separated by a field insulating layer 8 preferentially provided have N type epitaxial layers 5 as collector regions, respectively, to which N⁺ type collector lead regions 12 are connected. In each of the N type epitaxial layers 5, a P type base region 16 and a P⁺ type external base region 15 are formed and an N⁺ type emitter region 17 is formed in the P type base region 16.

Figure 8:
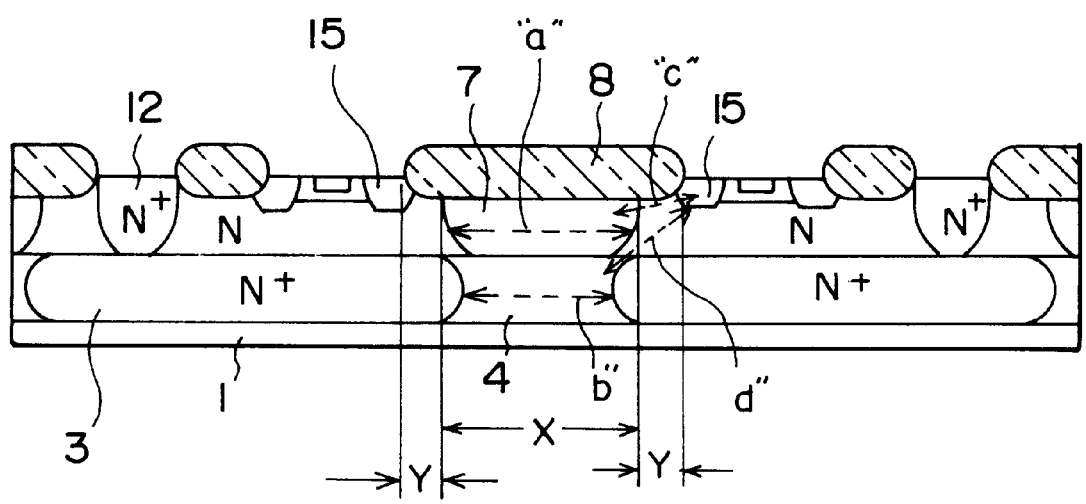
FIG. 8 is a cross section of the conventional device showing defects thereof.

Although not shown in FIG. 1, a P well region is formed in an area of the epitaxial layer 5 in which an N channel MOS transistor is to be formed and a N well region is formed in an area of the epitaxial layer 5 in which a P channel MOS transistor is to be formed, as in the conventional structure shown in FIG. 8.

In the epitaxial layer between the NPN bipolar transistors, a P well region 7 is formed for electrical separation therebetween and provides, together with the P⁺ type buried layer 4 below the P well region 7, an insulating region for electrically separating one of the NPN bipolar transistors from the other.

In the present invention, the width of the P⁺type buried layer 4 is larger than that of the P well region 7.

Figure 2:
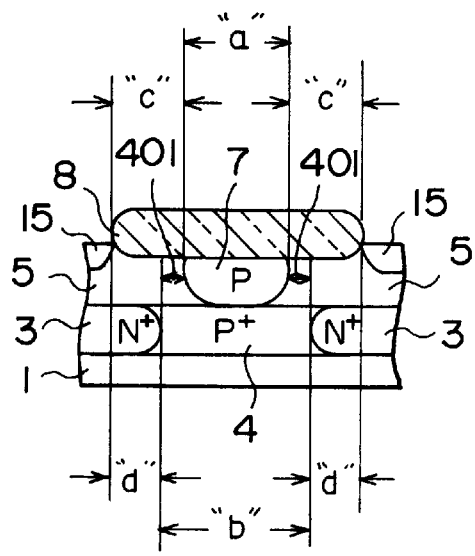
FIG. 2 is an enlarged cross of a portion of the semiconductor integrated circuit device shown in FIG. 1.

With such structure of the P type impurity region in the insulating region, it is possible to maintain the length "b" between the N⁺ buried layers 3 while making the length "c" between the external base 15 and the P well 7. Therefore, the insulating region between the bipolar transistors is reduced by an amount corresponding to the overlapped regions 401 (FIG. 2), resulting in the semiconductor integrated circuit having higher integration density, A method of forming the buried layers in this embodiment will be described with reference to FIGS. 3(a) to 3(e).

Figure 3A:
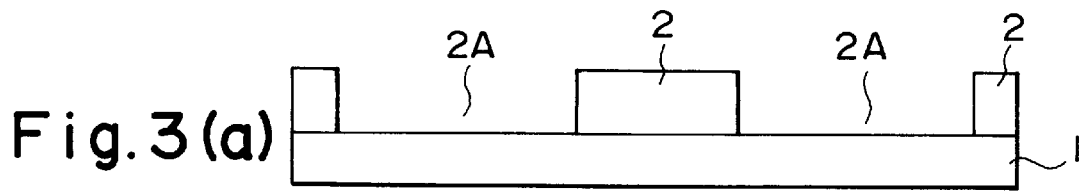
FIGS. 3(a) to 3(e) are cross sections of a semiconductor device showing a portion of a manufacturing method of the semiconductor integrated circuit device according to the first embodiment of the present invention.

As showing in FIG. 3(a), after a silicon oxide film 2 is grown on the P type silicon substrate 1 to a thickness of 30 to 100 nm, the silicon oxide film 2 is patterned by using photolithography, resulting in the silicon oxide film 2 having openings 2A. In order to avoid any damage of the silicon substrate 1, the etching of the silicon oxide film 2 is performed by wet-etching.

Then, the P type silicon substrate 1 is injected with an N type impurity such as arsenide under conditions of injection energy of 40 to 80 keV and dose of $5\times10^{14}$ to $5\times10^{15}$ cm$^{-2}$ by using the patterned thermal oxide film 2 as a mask.

Thereafter, the wafer is heat-treated in an oxygen atmosphere at a temperature as high as 1000 to 1200° C. for 2 to 4 hours to immigrate arsenide ions into the P type silicon substrate 1, so that the regions containing N type impurity of high density are rapidly oxidized, resulting in a thick oxide film.

Figure 3B:
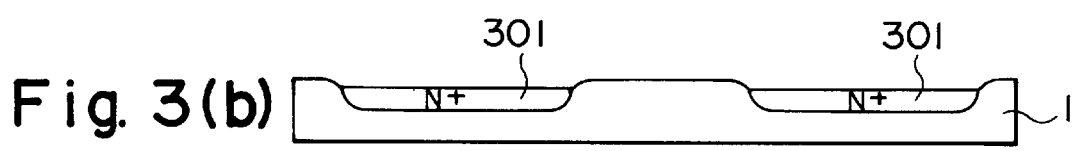

Then, the thermal oxide film 2 used as the mask for ion injection is removed by wet-etching, resulting in N⁺ type buried layer regions 301 on the P type silicon substrate 1, as shown in FIG. 3(b).

Figure 3C:
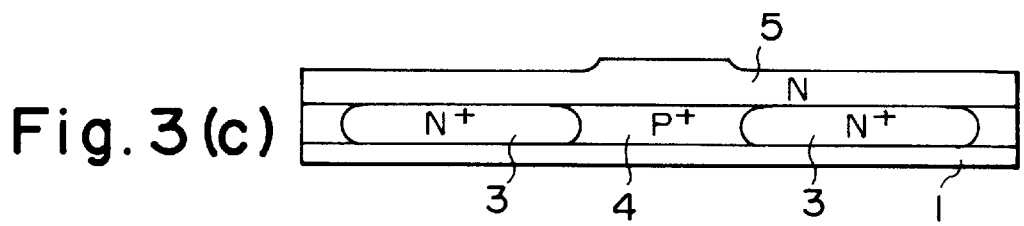

Then, a P type impurity such as boron is ion-injected to the whole surface of the wafer under conditions of injection energy of 80 to 120 keV and dose of $5\times10^{13}$ to $5\times^{13}$ cm$^{31\ 2}$. Thereafter, the epitaxial layers 5 are grown to a thickness of 0.8 to 1.2 μm, resulting in the N⁺ type buried layer 3 and the P⁺ type buried layer 4 as shown in FIG. 3(c).

Figure 3D:
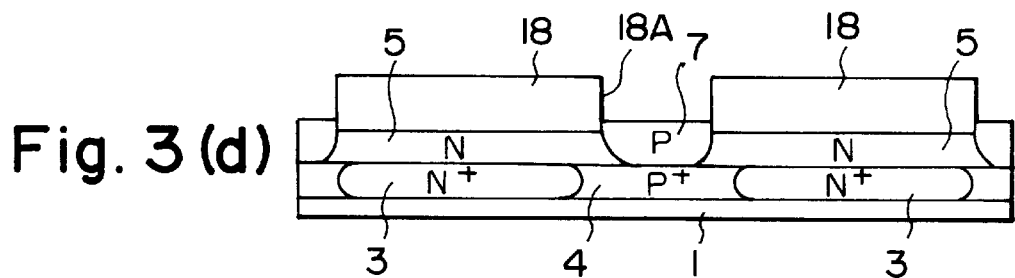

Then, as shown in FIG. 3(d), boron, for example, is ion-injected to the substrate by using a photo resist 18 having openings 18A as a mask, resulting in the P well region 7.

In this case, the width of the opening 18A is made smaller than the distance between the N⁺ type buried layers 3, that is, the width of the P⁺ buried layer 4.

Figure 3E:
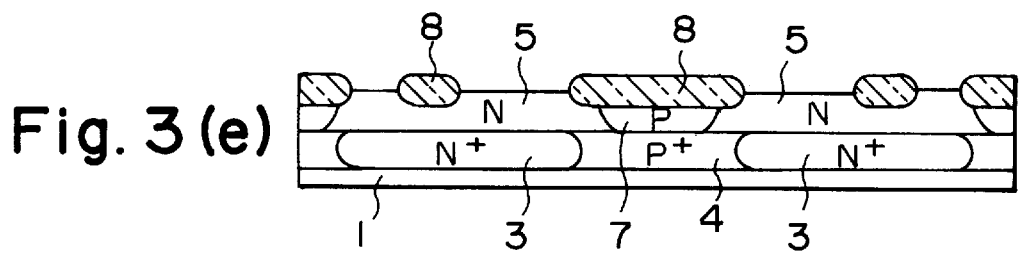

Thereafter, as shown in FIG. 3(e), the field insulating layers 8 are formed by using the known preferential thermal oxidation.

According to the first embodiment thus manufactured, it is possible to reduce the separating distance from 10 μm to 8 μm, that is, by 20%.

Figure 4:
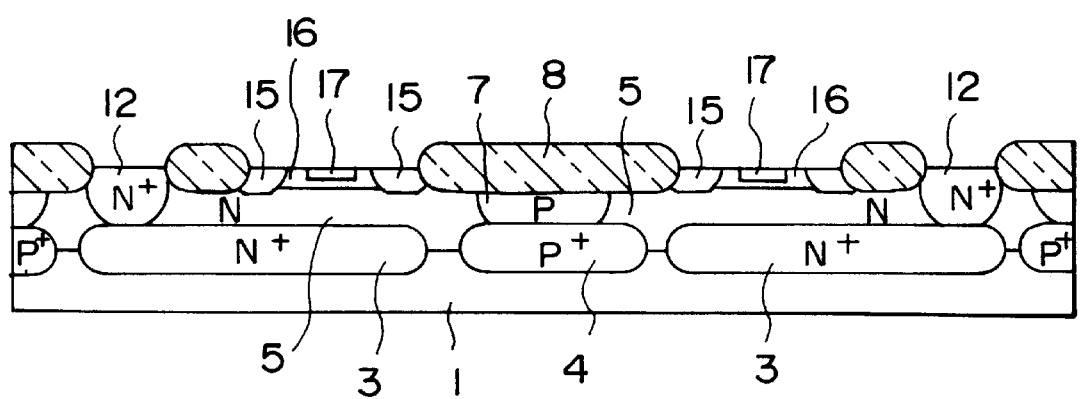
FIG. 4 is a cross section of a semiconductor integrated circuit device according to a second embodiment of the present invention.

Now, a second embodiment of the present invention will be described with reference to FIG. 4. In FIG. 4, the same or corresponding portions to those shown in FIG. 1 are denoted by the same reference numerals without detailed description thereof.

In FIG. 4, an N⁺ type buried layer 3 and a P⁺ type buried layer 4 are separated from each other and formed between a P type silicon substrate 1 and N type epitaxial layers 5 in a P type silicon substrate 1. A P type insulating and separating region for separating NPN bipolar transistors from other is formed by the P⁺ type buried layer 4 and a P type well region 7 formed thereon.

Also in this embodiment, the width of the P⁺ type buried layer 4 of the bipolar insulating region is larger than that of the P well region 7.

In the first embodiment, it is possible to form the N⁺ type buried layer 3 and the P⁺ type buried layer 4 by a single photolithographic step, while, in the second embodiment, a breakdown voltage between the N⁺ type buried layer 3 and the P⁺ type buried layer 4 is increased although the number of photolithographic steps is increased. Further, although, in the first embodiment, the edge of the P⁺ type buried layer 4 in the insulating and separating region does not overlap with the external base region 15 of the bipolar transistor, the edge of the P⁺ type buried layer 4 is further separated from the external base region 15 of the bipolar transistor in the second embodiment. Therefore, the influence of rise out of the impurity from the P⁺ type buried layer 4 is further reduced.

A method of forming the buried layers in the second embodiment will be described with reference to FIGS. 5(a) to 5(e).

Figure 5A:
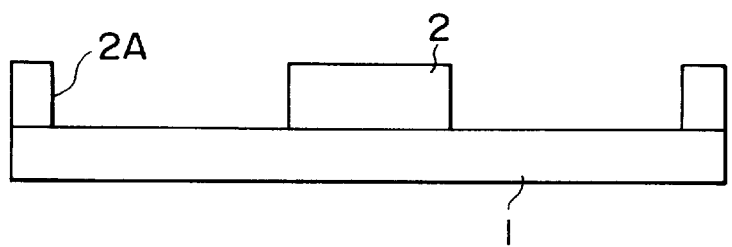
FIGS. 5(a) to 5(e) are cross sections of a semiconductor device showing a portion of a manufacturing method of the semiconductor integrated circuit device according to the second embodiment.
Figure 5B:
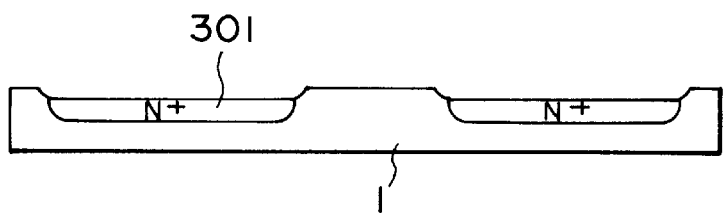

The steps shown in FIG. 5(a) and 5(b) are the same as those shown in FIGS. 3(a) and 3(b), respectively, and descriptions thereof are omitted to avoid duplication.

Figure 5C:
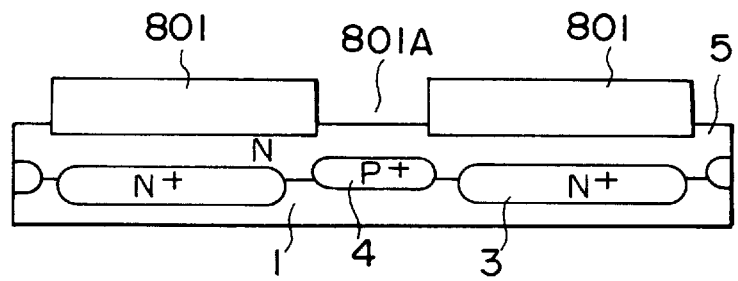

As shown in FIG. 5(c), the N type epitaxial layer 5 is grown to a thickness of 0.8 $\mu$m to 1.2 $\mu$m. Then, the P⁺ type buried layer 4 is formed by ion-injection of boron, for example, to the wafer under conditions of injection energy of 800 keV to 1.2 MeV and dose of $1\times10^{13}$ to $1\times10^{13}$ cm$^{-2}$ using a silicon oxide film 801 having openings 801A as a mask. In this case, the N⁺ type buried layer 3 and the P⁺ type buried layer 4 are not in contact with each other.

Figure 5D:
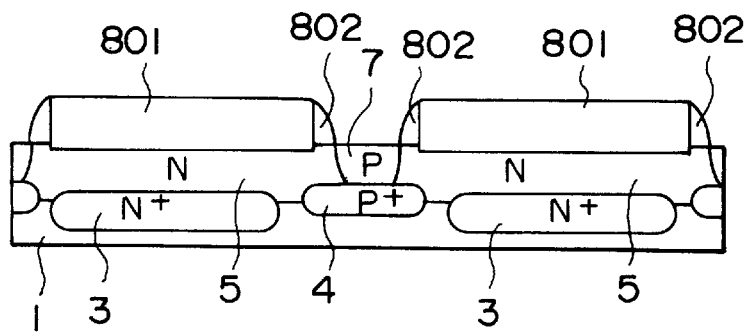

Then, as shown in FIG. 5(d), side walls 802 of silicon oxide film are formed and the P well region 7 is formed by ion injection.

Figure 5E:
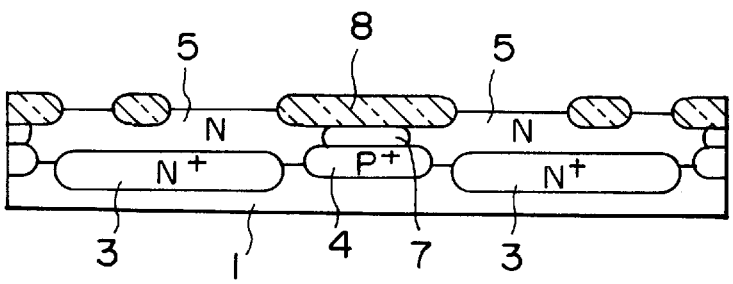
Figure 6:
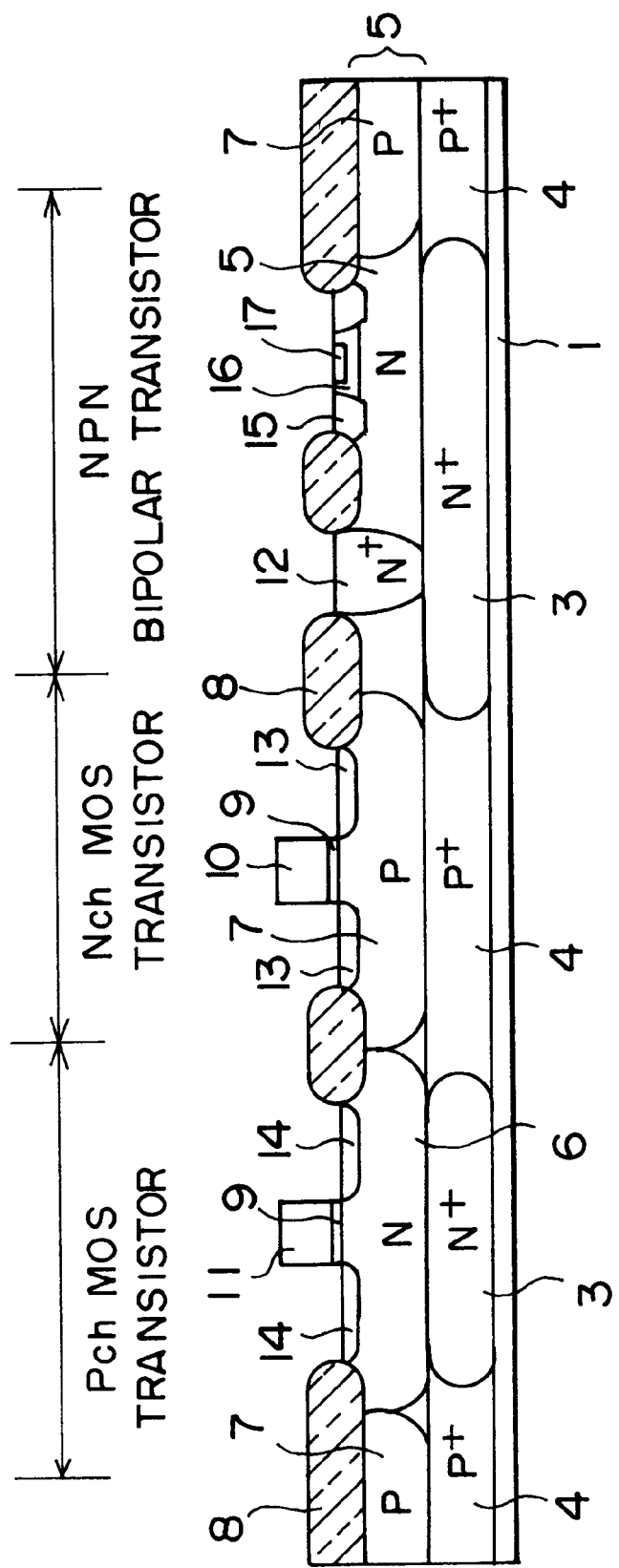
FIG. 6 is a cross section showing a conventional semiconductor integrated circuit device.
Figure 7A:
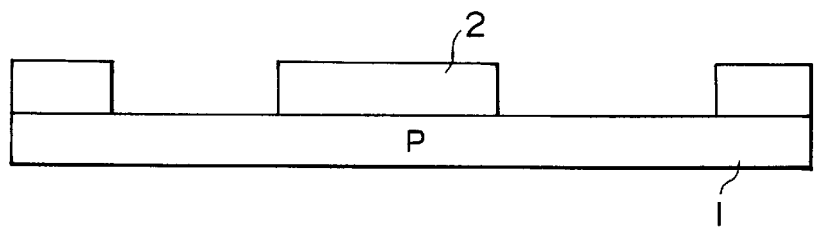
FIGS. 7(a) to 7(f) are cross sections of a semiconductor device showing a portion of a conventional manufacturing method of the semiconductor integrated circuit device.
Figure 7B:
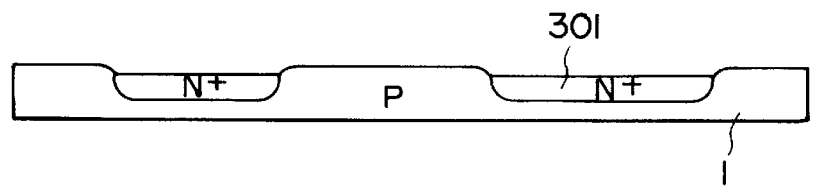
Figure 7C:
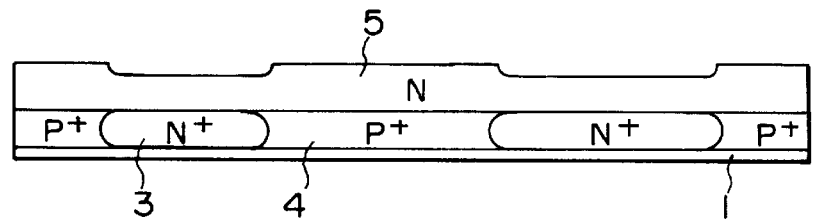
Figure 7D:
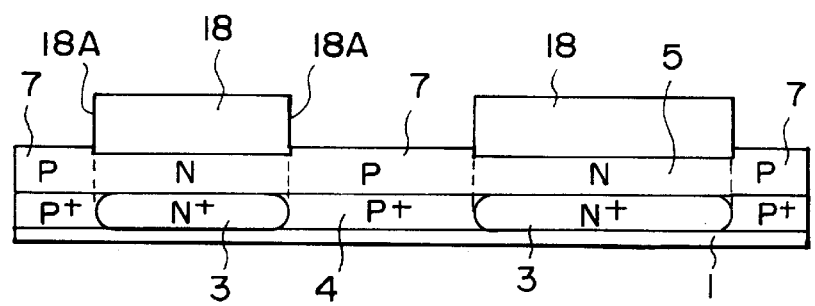
Figure 7E:
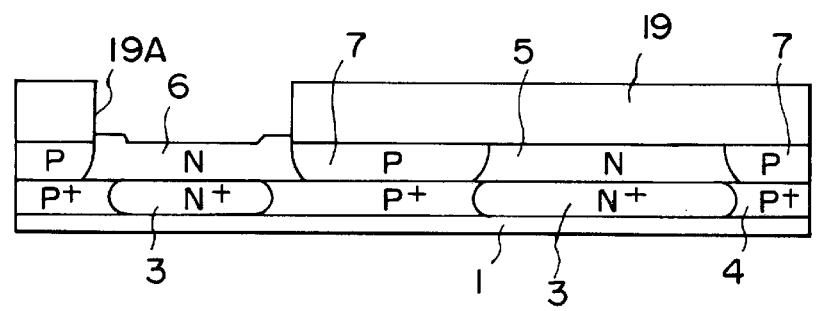
Figure 7F:
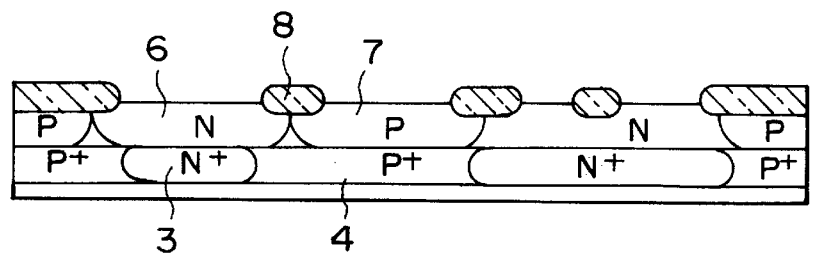

Finally, as shown in FIG. 5(e), the field insulating layers 8 are formed by using the known preferential thermal oxidation. According to the second embodiment manufactured in this manner, the rise out of impurity from the P⁺ buried layer can be further restricted and, therefore, it is possible to reduced the insulating and separating distance between the bipolar transistors by further 10%.

As described hereinbefore, the present invention provides an effect that the distance required to insulate and separate the bipolar transistors from each other can be reduced due to the fact that the well region of one conductivity channel type including the other conductivity channel type MOS transistor has a reversed T shaped P type impurity region by reducing the width of the first buried layer.

What is claimed is:

1. A semiconductor device comprising a PN junction element separating region, wherein said PN junction element region comprises an upper impurity layer of a first conductivity type having a low impurity density and a lower impurity layer of the first conductivity type having a high impurity density, said upper impurity layer contacting said lower impurity layer and wherein a width of said upper impurity layer is smaller than a width of said lower impurity layer;

wherein a first impurity region of second conductivity type having a low impurity density is provided adjacent to said upper impurity layer of said PN junction element separating region and a second impurity region of the first conductivity type having a high impurity density is formed in a surface of said first impurity region; and wherein a minimum length of a leak path between the upper impurity layer and said second impurity region is larger than a minimum length of a leak path between said lower impurity layer and said second impurity region, said leak path between the upper impurity layer and said second impurity region is a leakage current route between the upper impurity layer and said second impurity region, and said leak path between said lower impurity layer and said second impurity region is a leakage current route between said lower impurity layer and said second impurity region.

2. A semiconductor integrated circuit device comprising:

first buried layers of a first conductivity type having high impurity density, said first buried layers being provided below bipolar transistor forming regions and below a region in which an insulating-gate-type field effect transistor of a second conductivity type is formed, an insulating and separating region provided between said bipolar transistor forming regions, said insulating and separating region including a well region of the second conductivity type and a second buried layer of the second conductivity type having a higher impurity density than said well region and provided below said well region of the second conductivity type, wherein a width of said second buried layer of the second conductivity type of said insulating and separating region between said bipolar transistors is larger than a width of said well region of the second conductivity type positioned in an upper portion of said second buried layer;

wherein an edge of said second buried layer of the second conductivity type in said insulating and separating region between said bipolar transistors does not overlap with external base regions of said bipolar transistors; and wherein a minimum length of leak path between said well region and at least one of said base regions is larger than a minimum length of a leak path between said second buried layer and said at least one base region, said leak path between said well region and at least one of said base regions is a leakage current route between said well region and at least one of said base regions, and said leak path between said second buried layer and said at lest one base region is a leakage current route between said second buried layer and said at least one base region.

* * * * *